United States Patent
Minami et al.

[11] Patent Number: 6,110,222
[45] Date of Patent: Aug. 29, 2000

[54] LAYOUT DESIGN METHOD AND SYSTEM FOR AN IMPROVED PLACE AND ROUTE

[75] Inventors: Fumihiro Minami; Masako Murofushi, both of Kanagawa-ken, Japan

[73] Assignee: Kabushiki Kaisha Toshiba, Kawasaki, Japan

[21] Appl. No.: 09/076,490

[22] Filed: May 13, 1998

[30] Foreign Application Priority Data

May 13, 1997 [JP] Japan ................................ 9-122512

[51] Int. Cl.$^7$ .................................................. G06F 17/50
[52] U.S. Cl. ................................................. 716/9; 716/10
[58] Field of Search .......................... 395/500.1; 716/9, 716/10

[56] References Cited

U.S. PATENT DOCUMENTS

| | | | |
|---|---|---|---|
| Re. 35,671 | 11/1997 | Hartoog | 364/491 |
| 4,593,363 | 6/1986 | Burstein | 364/491 |
| 5,140,402 | 8/1992 | Murakata | 357/45 |
| 5,367,469 | 11/1994 | Hartoog | 364/491 |
| 5,469,366 | 11/1995 | Yang | 364/489 |
| 5,587,923 | 12/1996 | Wang | 364/490 |
| 5,610,833 | 3/1997 | Chang et al. | 364/491 |
| 5,774,371 | 6/1998 | Kawakami | 364/491 |
| 5,787,268 | 7/1998 | Sugiyama et al. | 395/500 |
| 5,798,936 | 8/1998 | Cheng | 364/489 |
| 5,838,582 | 11/1998 | Mehrotra et al. | 364/490 |
| 5,847,965 | 12/1998 | Cheng | 364/488 |
| 5,896,300 | 4/1999 | Raghavan et al. | 364/491 |
| 5,923,565 | 7/1999 | Smith et al. | 364/489 |
| 5,926,397 | 7/1999 | Yamanouchi | 364/491 |

FOREIGN PATENT DOCUMENTS

| | | |
|---|---|---|
| 406120343 | 4/1994 | Japan . |
| 08110915 | 4/1996 | Japan . |
| 8-110915 | 4/1996 | Japan . |

OTHER PUBLICATIONS

S. Prasitjutrakul et al., A Timing–Driven Global Router for Custom Chip Design, IEEE International Conference on Computer–Aided Design, pp. 48–51., Nov. 1990.

S. Kim et al., PERFLEX: A Performance Driven Module Generator, European Design Automation Conference, pp. 154–159., Sep. 1992.

Keh–Jeng Chang et al., HIVE: An Efficient Interconnect Capacitance Extractor to Support Submicron Multilevel Interconnect Designs, IEEE Conference on Computer–Aided Design, pp. 294–297, Nov. 1991.

H. Youssef et al., Timing Constraints for Correct Performance, IEEE International Conference on Computer–Aided Design, pp. 24–27, Nov. 1990.

S. Liu, Alleviating Routing Congestion by Combining logic Resynthesis and Linear Placement, 4th European Conference on Design Automation, pp. 578–582, Feb. 1993.

*Primary Examiner*—Paul R. Lintz
*Assistant Examiner*—A. M. Thompson
*Attorney, Agent, or Firm*—Foley & Lardner

[57] ABSTRACT

A layout design method and system for a semiconductor integrated circuit improves circuit performances related to operated frequency and power consumption by improved placement and routing. The method features an intersecting wiring predicting step that predicts the number of the intersecting wirings based on predicted wiring routes and an intersecting wiring capacitance calculating step that calculates the capacitances between the intersecting wirings.

20 Claims, 9 Drawing Sheets

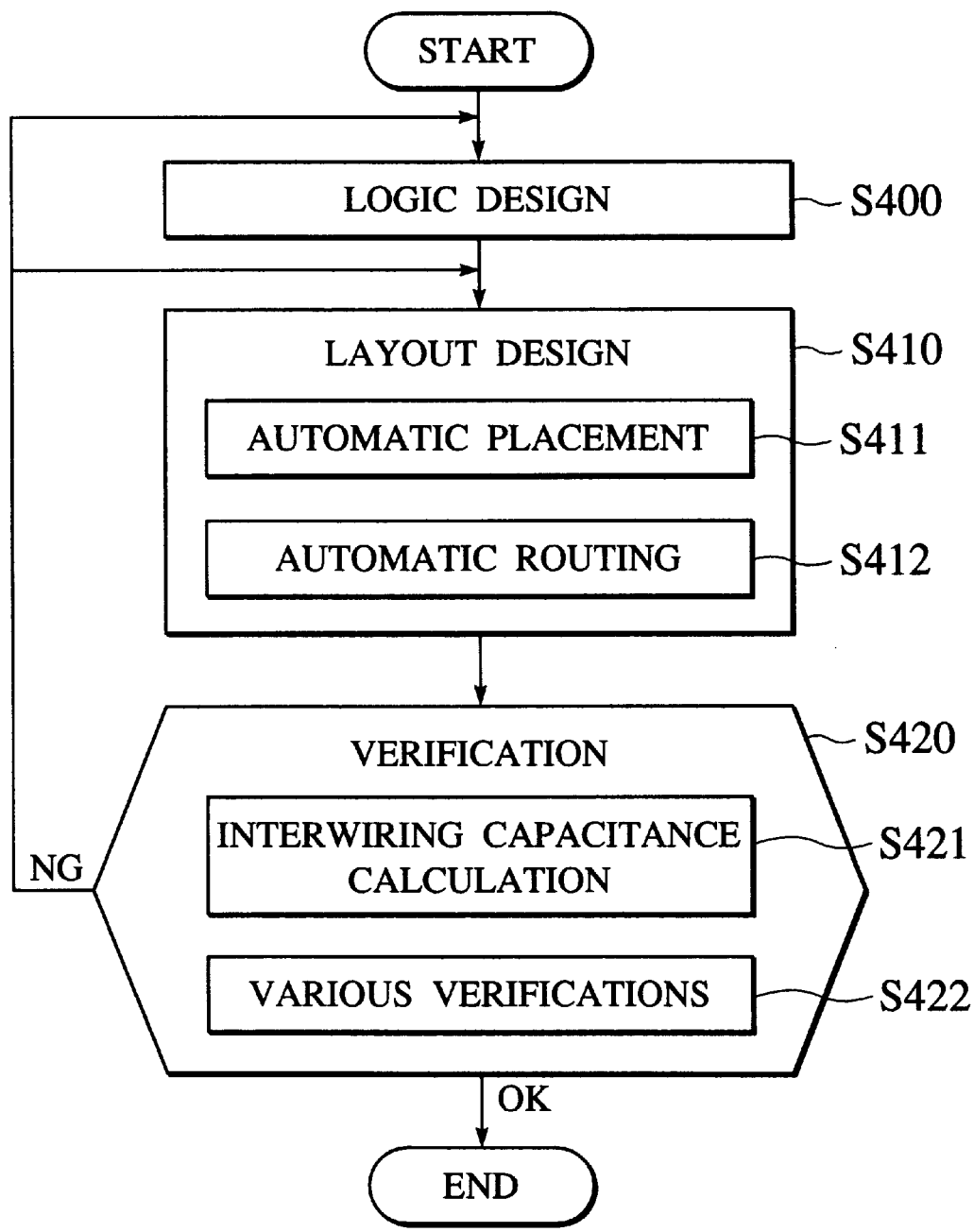

LAYOUT DESIGN METHOD AND SYSTEM FOR AN IMPROVED PLACE AND ROUTE

BACKGROUND OF THE INVENTION

1. Field of the Invention

The present invention relates to a semiconductor integrated circuit design system, a semiconductor integrated circuit design method, a computer-readable recording medium for recording a semiconductor integrated circuit design program, and a method of manufacturing the semiconductor integrated circuit and, more particularly, a technology for carrying out a semiconductor integrated circuit design effectively by estimating interwiring capacitances with good precision prior to routing process.

2. Description of the Related Art

In the semiconductor integrated circuit in the deep submicron generation, it would be anticipated that capacitances between adjacent wirings and capacitances between intersecting wirings are increased. FIGS. 1A and 1B are views illustrating the capacitances between adjacent wirings and the capacitances between intersecting wirings. FIG. 1A shows a sectional model illustrative of a simple parallel plates in an ordinary semiconductor integrated circuit. In this model, a first layer aluminum wiring 12 is provided over a substrate 11 of the semiconductor integrated circuit along a directional perpendicular to the surface of the drawing, so that a wiring capacitance is generated between the substrate 11 and the aluminum wiring 12. FIG. 1B shows a sectional model illustrative of the capacitances between adjacent wirings and the capacitances between intersecting wirings. In this model, three first layer aluminum wirings 12 are provided over the substrate 11 of the semiconductor integrated circuit along the direction perpendicular to the surface of the drawing. In addition, a second layer aluminum wiring 13 is provided over three first layer aluminum wirings 12. Where a notation "capacitance between adjacent wirings" signifies an interwiring capacitance which is generated between adjacent parallel wirings while a notation "capacitance between intersecting wirings" signifies an interwiring capacitance which is generated between intersecting wirings. With the progress of miniaturization of the semiconductor integrated circuit, a distance between the substrate and the wiring and a distance between the wirings have been prone to be reduced. Accordingly, these interwiring capacitances have been increased.

FIG. 2 is a flowchart showing processes carried out by the semiconductor integrated circuit design method in the prior art. In this prior art, at first a logic design of the semiconductor integrated circuit has been carried out (step S400). Then, a layout design of the semiconductor integrated circuit which has been subjected to the logic design has been carried out (step S410). The layout design is made up of an automatic placement step S411 of executing the placements of necessary cells, etc. and an automatic routing step S412 of executing the wirings of the placed cells, etc. Subsequently, verification of the semiconductor integrated circuit which has been subjected to the layout design has been carried out (step S420). In this verification, an interwiring capacitance calculation has been executed (step S421) and also various verifications have been executed (step S422).

In general, inasmuch as it has not been defined which wirings should be provided in parallel with, or over/below respective wirings after the layout design has been finished, the capacitance between adjacent wirings and the capacitance between intersecting wirings cannot be calculated. Accordingly, these verifications have been carried out after the layout design of the wirings has been finished in the prior art.

As a result of these verifications, design of the semiconductor integrated circuit has been finished if requirements specification have been satisfied. In contrast, the process returns to the step S400 of logic design and the step S410 of layout design to thus carry out the design again unless requirements specification have been satisfied.

In this manner, in the design of the semiconductor integrated circuit in the prior art, there has been a problem such that, since the layout design and the logic design must be carried out once again according to the verification result, a design term has been extended.

In order to reduce the design term, performances of the semiconductor integrated circuit such as operating frequency, power consumption, etc. must be improved automatically. Therefore, the connectivity list and the layout of the semiconductor integrated circuit must be optimized by estimating precise interwiring capacitances including the capacitance between adjacent wirings and the capacitance between the intersecting wirings prior to the detailed routing, i.e., after the automatic placement or upon the automatic placement.

Meanwhile, such a method has been proposed that an "adjacent rate" and an "intersecting rate" of each chip are calculated to estimate the delay in the chip at the stage after the detailed routing has been finished (Patent Application Publication (KOKAI) Hei 8-110915, Inventor: Yukihiko Matsuda). However, the method in which the capacitances between adjacent wirings are considered at the stage before the cell placement have large estimation error and therefore is unsuitable for information to optimize each net. On the other hand, by the method in which the adjacent rate and the intersecting rate are estimated after the detailed routing, such rates cannot be used as information to optimize at the stage of the automatic placement or the automatic routing. More particularly, since the capacitances between adjacent wirings and the capacitance between intersecting wirings are optimized at the stage of the automatic placement or the automatic routing, they have not been able to be estimated after the cell placement has been completed but the wirings have not been provided yet.

Moreover, it has been known that the capacitances between adjacent wirings can be improved drastically by expanding the wire spacing. FIG. 3 is a graph showing the result of three-dimensional simulation indicating a relationship between an interwiring capacitance and an adjacent spacing. In FIG. 3, an abscissa denotes the adjacent spacing ($\mu$m) and an ordinate denotes the interwiring capacitance (pF/mm). As shown in FIG. 3, the interwiring capacitance can be reduced if the adjacent spacing is enlarged by expanding the wiring interval. Hence, reduction in the delay has been tried by manual correction by imposing the wiring spacing constraint on respective wirings. Expansion of the net wire spacing has been employed widely in the layout design. Like this, in the method in which the wire spacing is extended only in a part of nets, since the wire spacing in most parts of nets has still remained narrow, the area of the semiconductor integrated circuit which is used for the wirings has not been so increased. However, the constraints has not been able to be generated based on the capacitances between adjacent wirings and the capacitance between the intersecting wirings which have been estimated prior to the automatic routing, to carry out the automatic layout.

SUMMARY OF THE INVENTION

The present invention has been made in view of the above circumstances and it is an object of the present invention to provide a semiconductor integrated circuit design system, a semiconductor integrated circuit design method, a computer-readable recording medium for recording a semiconductor circuit design program, and a method of manufacturing the semiconductor integrated circuit, which are capable of carrying out a semiconductor integrated circuit design effectively by estimating interwiring capacitances with good precision prior to routing process to thus shorten a term or man-hour of the semiconductor integrated circuit design.

As the preferred embodiment of the present invention, a design system for a semiconductor integrated circuit, comprises:

a placing unit for carrying out a layout placement of the semiconductor integrated circuit;

an interwiring capacitance calculator for calculating capacitances between adjacent wirings of the semiconductor integrated circuit which has been subjected to the layout design effected by the placing unit; and a re-placing unit for carrying out a layout re-placement of the semiconductor integrated circuit based on calculation results;

wherein the interwiring capacitance calculator comprises, a wiring route predicting unit for predicting routes of wirings of the semiconductor integrated circuit, an adjacent wiring length predicting unit for predicting adjacent wiring lengths based on predicted routes, and an adjacent wiring capacitance calculator for calculating the capacitances between the adjacent wirings based on the adjacent wiring lengths being calculated.

As the preferred embodiment of the present invention, a design system for a semiconductor integrated circuit, comprises:

a logic design unit for carrying out a logic design of the semiconductor integrated circuit;

a placing unit for carrying out a layout placement of the semiconductor integrated circuit which has been subjected to the logic design;

an interwiring capacitance calculator for calculating capacitances between adjacent wirings of the semiconductor integrated circuit which has been subjected to the layout placement effected by the placing unit;

a re-placing unit for carrying out a layout re-placement of the semiconductor integrated circuit based on calculation results; and a wiring unit for carrying out layout wirings of the semiconductor integrated circuit which has been subjected to the layout re-placement;

wherein the interwiring capacitance calculator comprises, a wiring route predicting unit for predicting routes of wirings of the semiconductor integrated circuit, an adjacent wiring length predicting unit for predicting adjacent wiring lengths based on predicted routes, and an adjacent wiring capacitance calculator for calculating the capacitances between the adjacent wirings based on the adjacent wiring lengths being calculated.

As the preferred embodiment of the present invention, a design system for a semiconductor integrated circuit, comprises:

a logic design unit for carrying out a logic design of the semiconductor integrated circuit;

a placing unit for carrying out a layout placement of the semiconductor integrated circuit which has been subjected to the logic design;

an interwiring capacitance calculator for calculating capacitances between intersecting wirings of the semiconductor integrated circuit which has been subjected to the layout placement effected by the placing unit;

a re-placing unit for carrying out a layout re-placement of the semiconductor integrated circuit based on calculation results; and a wiring unit for carrying out layout wirings of the semiconductor integrated circuit which has been subjected to the layout re-placement;

wherein the interwiring capacitance calculator comprises, a wiring route predicting unit for predicting routes of wirings of the semiconductor integrated circuit, an intersecting wiring predicting unit for predicting a number of the intersecting wirings based on predicted routes, and an intersecting wiring capacitance calculator for calculating the capacitances between the intersecting wirings based on the number of the intersecting wirings being calculated.

As the preferred embodiment of the present invention, a design method for a semiconductor integrated circuit, comprises:

a placing step of carrying out a layout placement of the semiconductor integrated circuit;

an interwiring capacitance calculating step of calculating capacitances between adjacent wirings of the semiconductor integrated circuit which has been subjected to the layout design effected by the placing step; and a re-placing step of carrying out a layout re-placement of the semiconductor integrated circuit based on calculation results;

wherein the interwiring capacitance calculating step comprises, a wiring route predicting step of predicting routes of wirings of the semiconductor integrated circuit, an adjacent wiring length predicting step of predicting adjacent wiring lengths based on predicted routes, and an adjacent wiring capacitance calculating step of calculating the capacitances between the adjacent wirings based on the adjacent wiring lengths being calculated.

As the preferred embodiment of the present invention, a design method for a semiconductor integrated circuit, comprises:

a placing step of carrying out a layout placement of the semiconductor integrated circuit;

an interwiring capacitance calculating step of calculating capacitances between intersecting wirings of the semiconductor integrated circuit which has been subjected to the layout placement effected by the placing step; and a re-placing step of carrying out a layout re-placement of the semiconductor integrated circuit based on calculation results;

wherein the interwiring capacitance calculating step comprises, a wiring route predicting step of predicting routes of wirings of the semiconductor integrated circuit, an intersecting wiring predicting step of predicting a number of the intersecting wirings based on predicted routes, and an intersecting wiring capacitance calculating step of calculating the capacitances between the intersecting wirings based on the number of the intersecting wirings being calculated.

The wiring route predicting step comprises the steps of, dividing the semiconductor integrated circuit into a plurality of wiring regions, calculating routing congestions of respective wiring regions, and predicting the routes of respective wirings based on the routing congestions.

The wiring route predicting step comprises the steps of, dividing the semiconductor integrated circuit into a plurality of wiring regions, calculating routing congestions for respective sides of wiring regions, and predicting the routes of respective wirings based on the routing congestions.

The wiring route predicting step comprises the steps of, dividing the semiconductor integrated circuit into a plurality of wiring regions, calculating routing congestions for respective wiring layers of the wiring regions, and predicting the routes of respective wirings based on the routing congestions.

The adjacent wiring length predicting step comprises the steps of, dividing the semiconductor integrated circuit into a plurality of wiring regions, calculating routing congestions of respective wiring regions, and predicting the adjacent wiring lengths based on the routing congestions.

The adjacent wiring length predicting step comprises the steps of, dividing the semiconductor integrated circuit into a plurality of wiring regions to predict wiring lengths passing through respective wiring regions, predicting expected values of adjacent wiring lengths of respective wiring regions based on routing congestions, and predicting the adjacent wiring lengths of respective wiring regions based on predicted expected values of the adjacent wiring lengths.

The step of predicting expected values of adjacent wiring lengths of respective wiring regions based on routing congestions, includes the step of calculating the expected values of adjacent wiring lengths as a function of routing congestion.

The step of predicting expected values of adjacent wiring lengths of respective wiring regions based on routing congestions, includes the step of calculating the expected values of adjacent wiring lengths as functions of routing congestion and adjacent wire spacing.

The adjacent wiring length predicting step comprises the steps of, calculating wiring lengths and directions of respective wirings and wiring layers, for respective wiring regions through which wirings pass, calculating the expected values of adjacent wiring lengths for respective wiring regions based on calculated routing congestion, calculating predicted values of the adjacent wiring lengths for respective wiring regions, and calculating a total sum of adjacent wiring lengths based on the predicted values of the adjacent wiring lengths.

The intersecting wiring predicting step comprises the steps of, dividing the semiconductor integrated circuit into a plurality of wiring regions, predicting wiring lengths passing through respective wiring regions, calculating a number of wirings passing through respective sides of respective wiring regions, calculating average numbers of wirings passing through vertical sides and horizontal sides of respective wiring regions, calculating an intersecting number of wirings based on the average numbers of wirings, and calculating a total intersecting number of wirings based on intersecting numbers of wirings being calculated for respective wiring regions.

The re-placing step comprises the steps of, carrying out a calculation of capacitances between adjacent wirings or capacitances between intersecting wirings of the semiconductor integrated circuit which has been subjected to the layout placement effected by the placing step, calculating a critical path by calculating delay based on the capacitances between adjacent wirings or the capacitances between intersecting wirings of the semiconductor integrated circuit, determining whether or not the critical path has satisfied specifications, carrying out the layout re-placement of the semiconductor integrated circuit after generating path delay constraints unless the critical path has satisfied specifications, carrying out the calculation of the capacitances between adjacent wirings of the semiconductor integrated circuit which has been subjected to the layout re-placement, calculating the critical path by calculating delay based on the capacitances between adjacent wirings or the capacitances between intersecting wirings of the semiconductor integrated circuit which has been subjected to the layout re-placement, and setting a lower limit value of net wiring distance unless the critical path has satisfied specifications, and then carrying out the layout re-placement of the semiconductor integrated circuit after generating the path delay constraints.

As the preferred embodiment of the present invention, a computer-readable recording medium for recording a design program for a semiconductor integrated circuit, comprises:

a placing step of carrying out a layout placement of the semiconductor integrated circuit;

an interwiring capacitance calculating step of calculating capacitances between adjacent wirings or capacitances between intersecting wirings of the semiconductor integrated circuit which has been subjected to the layout design effected by the placing step; and a re-placing step of carrying out a layout re-placement of the semiconductor integrated circuit based on calculation results;

wherein the interwiring capacitance calculating step comprises, a wiring route predicting step of predicting routes of wirings of the semiconductor integrated circuit, an adjacent wiring length predicting step of predicting adjacent wiring lengths based on predicted routes, and an adjacent wiring capacitance calculating step of calculating the capacitances between the adjacent wirings based on the adjacent wiring lengths being calculated.

As the preferred embodiment of the present invention, a method of manufacturing a semiconductor integrated circuit, comprises:

a placing step of carrying out a layout placement of the semiconductor integrated circuit;

an interwiring capacitance calculating step of calculating capacitances between adjacent wirings of the semiconductor integrated circuit which has been subjected to the layout design effected by the placing step;

a re-placing step of carrying out a layout re-placement of the semiconductor integrated circuit based on calculation results;

a wiring step of carrying out a layout wiring of the semiconductor integrated circuit which has been subjected to the layout re-placement; and a manufacturing step of manufacturing the semiconductor integrated circuit which has been subjected to the layout wiring;

wherein the interwiring capacitance calculating step comprises, a wiring route predicting step of predicting routes of wirings of the semiconductor integrated circuit, an adjacent wiring length predicting step of predicting adjacent wiring lengths based on predicted routes, and an adjacent wiring capacitance calculating step of calculating the capacitances between the adjacent wirings based on the adjacent wiring lengths being calculated.

BRIEF DESCRIPTION OF THE DRAWINGS

FIG. 2 is a flowchart showing processes carried out by the semiconductor integrated circuit design method in the prior art;

DETAILED DESCRIPTION OF THE EMBODIMENTS

A semiconductor integrated circuit design system, a semiconductor integrated circuit design method, a computer-readable recording medium for recording a semiconductor integrated circuit design program, and a method of manufacturing the semiconductor integrated circuit according to the embodiments of the present invention will be explained in detail with reference to the accompanying drawings hereinafter.

In the semiconductor integrated circuit design system according to embodiments of the present invention, a hardware configuration can be embodied by using a normal computer system which comprises a CPU for executing various processes, an input device such as keyboard, a mouse, a light pen, a flexible disk drive, or the like, an external memory device such as a memory device, a disk drive, or the like, an output device such as a display device, a printer device, or the like, and so on. Various operations can be implemented by installing a software for carrying out following processes into the computer system. In operation, various variables to be described later in following embodiments are saved in the memory device, or the like, and then the CPU reads such saved variables appropriately to execute data processing.

In embodiments of the present invention, a path delay out of various performances of the semiconductor integrated circuit will be improved so as to satisfy the specification of operating frequency. Therefore, based on estimated values of capacitances between adjacent wirings and capacitances between intersecting wirings, constraints as for the path delay are imposed on the placement and also constraints as for wiring distance are imposed on the wirings.

Figure 4:
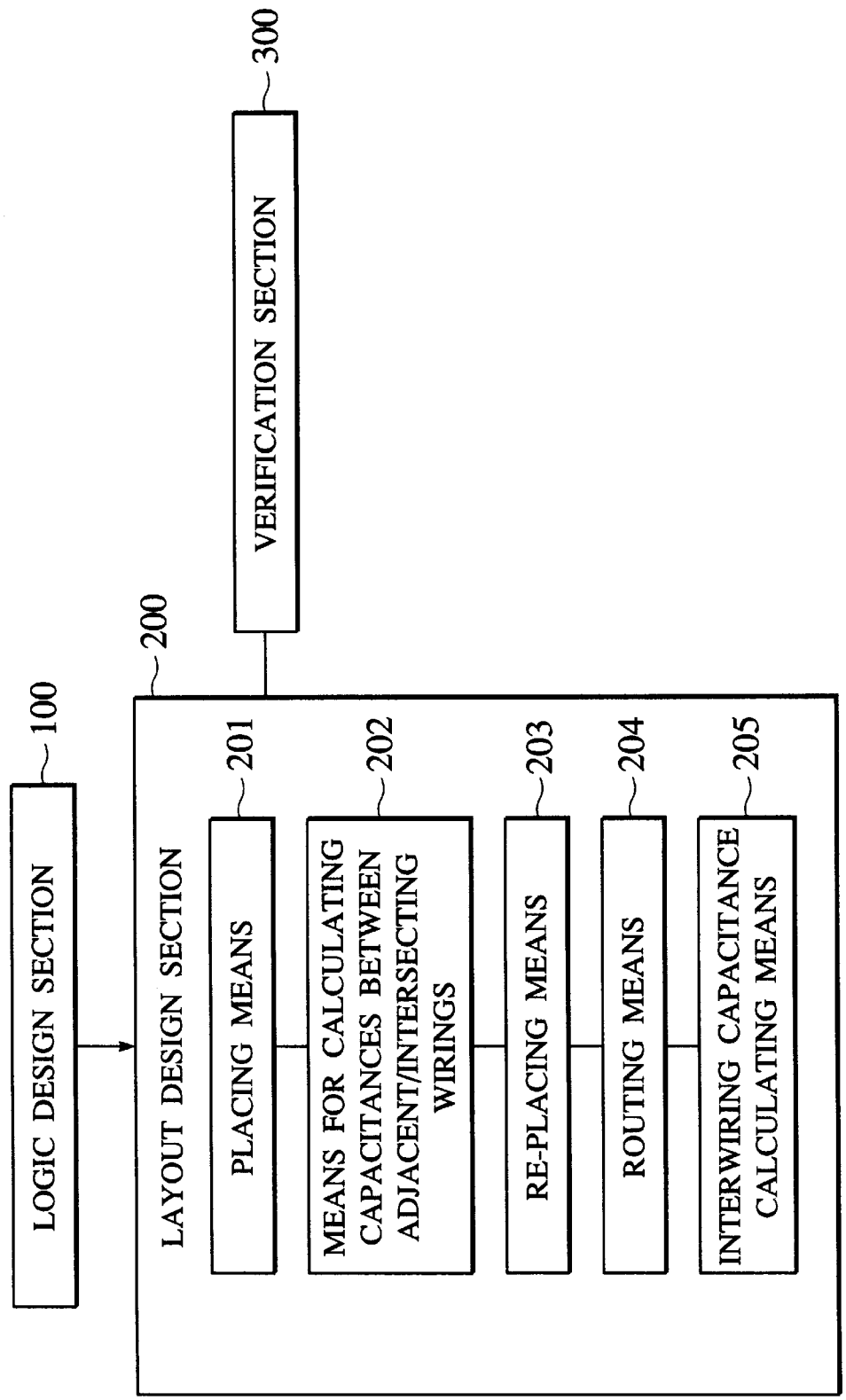
FIG. 4 is a block diagram showing a semiconductor integrated circuit design system according to an embodiment of the present invention.

FIG. 4 is a block diagram showing a semiconductor integrated circuit design system according to an embodiment of the present invention. The semiconductor integrated circuit design system comprises a logic design section 100 for executing a logic design of the semiconductor integrated circuit; a layout design section 200 which includes a placing means 201 for executing a layout placement of the semiconductor integrated circuit which has been subjected to the logic design, an adjacent/intersecting wirings capacitance calculating means 202 for calculating the capacitances between adjacent wirings and the capacitances between intersecting wirings of the semiconductor integrated circuit which has been subjected to the layout placement effected by the placing means 201, a re-placing means 203 for executing the layout re-placement based on such calculated capacitances between adjacent/intersecting wirings, a routing means 204 for executing a layout wiring of the semiconductor integrated circuit which has been subjected to the layout re-placement, and an interwiring capacitance calculating means 205 for calculating the interwiring capacitance of the semiconductor integrated circuit which has been subjected to the layout wiring; and a verification section 300 for executing various verifications of the semiconductor integrated circuit.

The semiconductor integrated circuit design system according to the embodiments can be constructed to improve the placement of the semiconductor integrated circuit prior to the wiring process with regard to the capacitances between adjacent/intersecting wirings. Hence, since the repeating number of times of the placement can be reduced unlike the prior art, the semiconductor integrated circuit design can be accomplished effectively and at high speed by estimating the interwiring capacitances with good precision prior to the wiring process.

Next, respective configurations of the present embodiment will be explained. First, the logic design section 100 executed the logic design of the semiconductor integrated circuit. This logic design can be carried out by using the publicly known technology.

Then, the layout design section 200 will be explained. The layout design section 200 executes the layout design of the semiconductor integrated circuit. At first, the placing means 201 executes the placement of functional blocks of the semiconductor integrated circuit. This placement can be carried out by using the publicly known technology.

Then, the means 202 for calculating the capacitances between adjacent/intersecting wirings will be explained to be classified into following embodiments.

EMBODIMENT 1

Figure 5:
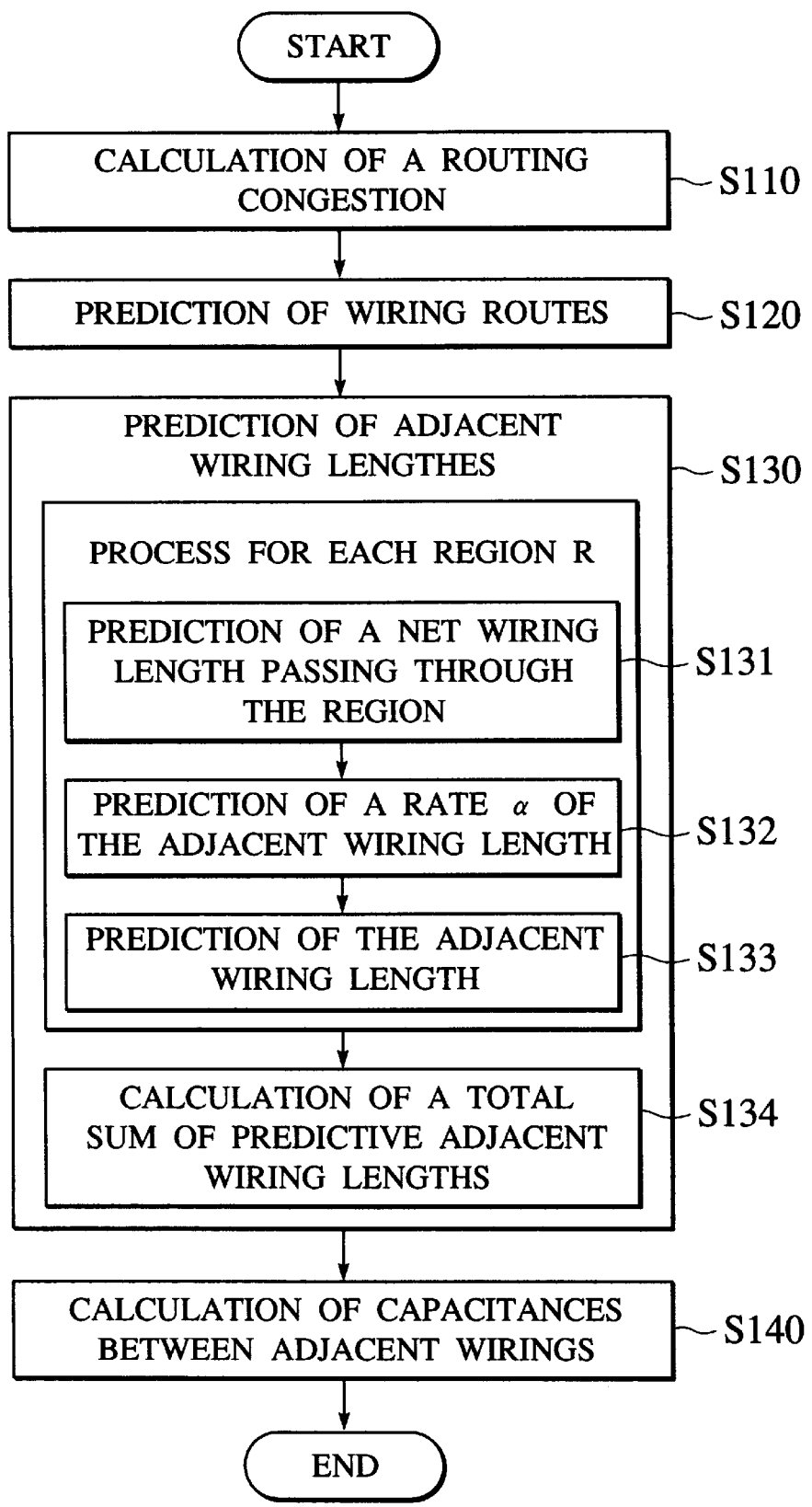
FIG. 5 is a flowchart showing the process carried out by a means 202 for calculating capacitances between adjacent wirings in FIG. 4.

FIG. 5 is a flowchart showing the process carried out by a means 202 for calculating capacitances between adjacent wirings of the present invention. First, a routing congestion is calculated (step S110). Here a semiconductor chip whose layout placement has been finished is segmented into previously given m×n regions (m, n are arbitrary integers) and the routing congestion for each side of the region is calculated in respective regions. As the first method of calculating the routing congestion, the technology concerning the method which is able to estimate the routing congestion without the global routing has been disclosed (Patent Application Publication (KOKAI) Hei 8-247399, Applicant: Toshiba Corporation). In this method, rectangles are set on all nets and then the routing congestion can be estimated by the stochastic approach. According to this method, the routing congestion can be estimated with good accuracy and at high speed without actual wirings. As the second method, there is the method of calculating the routing congestion on the basis of the number of nets (called also as the number of cuts) crossing respective regions. As the third method, after it has been decided to some extent by executing the global routing to decide schematic routings which regions of the semiconductor chip are occupied by respective nets in the detailed routing, the routing congestions can be calculated based on the number of nets existing in respective regions.

Figure 6:
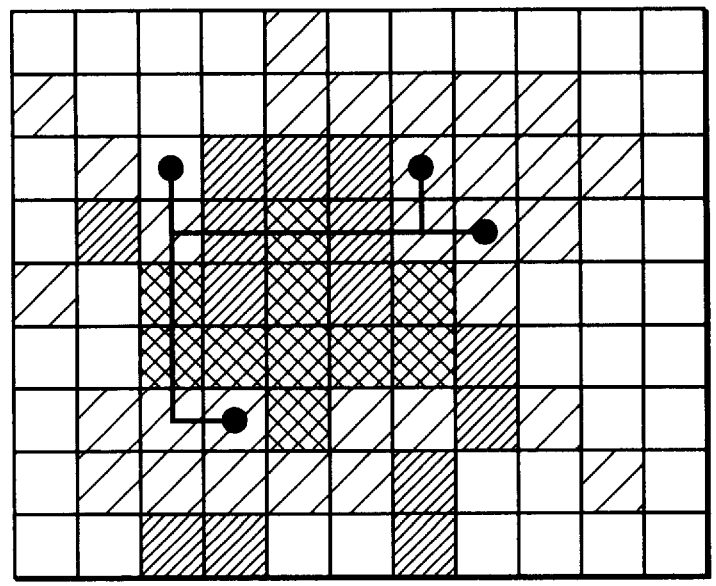
FIG. 6 is a view illustrative of a situation between a routing congestion and wiring routes in a semiconductor chip.

Then, schematic wiring routes for respective nets are predicted (step S120). In this prediction, the routing congestions calculated by step S110 can be employed. As the first method of predicting the schematic wiring routes, there is the method in which a minimum tree called a Steiner tree is formed and then the routing can be implemented by using the Steiner tree. This method can predict the wiring routes without calculation of the routing congestion. In contrast, the main Steiner tree may be formed while avoiding the regions having high routing congestion with regard to the routing congestion. The second method will be explained with reference to FIG. 6. FIG. 6 is a view illustrative of a situation between a routing congestion and wiring routes in a semiconductor chip. The semiconductor integrated circuit which has been subjected to the placement is segmented into the m×n regions, then the routing congestions are calculated in respective directions in respective regions, and then the schematic routings are predicted based on such calculation results. In FIG. 6, the thicker the oblique lines, the higher the routing congestion. In this case, according to information of the routing congestion, the global routing can be established while escaping the regions having the higher routing congestion. Then, the regions of the chip through which respective nets should be provided in the detailed routing are decided.

Figure 7:
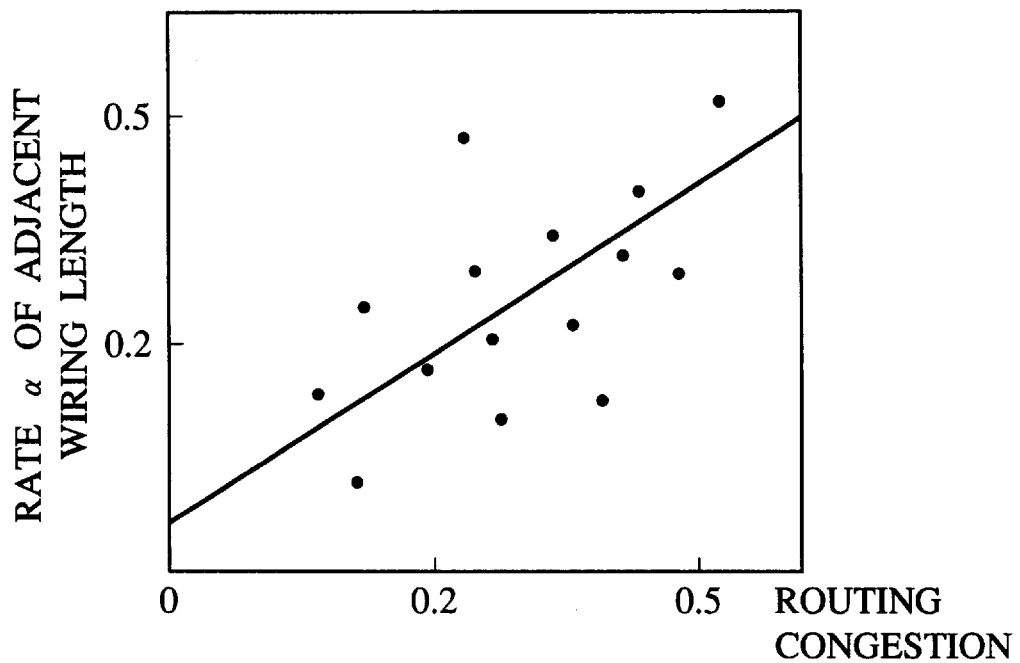
FIG. 7 is a graph showing a relationship between a routing congestion and an expected value of the adjacent wiring length.

Next, the adjacent wiring lengths of respective nets passing through the regions are predicted (step S130). The adjacent wiring lengths are predicted, as the net wiring lengths passing through the region and their directions, for respective wiring layers in each wiring region R through which respective nets are passed (step S131). In prediction, the adjacent wiring lengths may be predicted based on the routing congestion. Subsequently, an expected value α of the adjacent wiring length is predicted for each wiring region R based on the routing congestion (step S132). This prediction method calculates the expected value α of the adjacent wiring length as a function of the routing congestion. Where the expected value of the adjacent wiring length means a rate of adjacent wiring lengths of respective wirings. For instance, assuming that a length of the objective wiring is set to 1, if all adjacent wiring tracks are fully occupied by the other wires on both sides of the objective wiring, the expected value of the adjacent wiring length becomes 1. If a wiring having a length 1 exist on one side of adjacent wiring tracks of the objective wiring, the expected value of the adjacent wiring length becomes 0.5. FIG. 7 is a graph showing a relationship between the routing congestion and the expected value of the adjacent wiring length. In the graph in FIG. 7, an abscissa denotes the routing congestion and an ordinate denotes the expected value of the adjacent wiring length. As shown in FIG. 7, from the last design data, etc., the expected value α of the adjacent wiring length can be approximated as a linear function and then K and λ in Eq.(1) are prepared.

$$\alpha = f(routing\_congestion) \quad (1)$$
$$= K \times (routing\_congestion) + \lambda$$

Where the expected value of the adjacent wiring length is set differently according to wiring layers and wiring directions (vertical direction, horizontal direction, etc.). In this case, K and λ are defined as constant parameters for respective wiring layers and respective wiring directions. The expected value of the adjacent wiring length can be calculated by approximating as the linear function of the routing congestion.

Then, a prediction value LEr of the adjacent wiring length in the region can be calculated according to Eq.(2) (step S133).

$$LEr = \alpha \times (net\_wiring\_length) \quad (2)$$

Then, a total sum LE of the adjacent wiring lengths LEr calculated for respective wiring regions is calculated according to Eq.(3) (step S134)

$$LE = \sum_r LEr \quad (3)$$

Next, the capacitances between adjacent wirings are calculated (step S140). The capacitances Cn between adjacent wirings in respective nets are calculated by using Eq.(4) and then added to the interwiring capacitances.

$$Cn = LE \times \eta \quad (4)$$

Where η is an average capacitance between adjacent wirings generated by the adjacent wirings having a unit length. In this manner, the rates of adjacent wirings of respective nets can be calculated from the routing congestion for respective regions in the chip. This rates can be estimated with considerable accuracy since the cell placement has been already executed. In addition, since the lengths of adjacent wirings of respective nets can be estimated in respective regions separately, it is possible to estimate the lengths of adjacent wirings, in its turn, the capacitances between adjacent wirings with good accuracy.

According to the present embodiment, since the capacitances between adjacent wirings can be calculated prior to the detailed routing, performance data can be estimated precisely at the time of the placement or after the placement and thus optimization of the detailed connectivity list and the layout can be accomplished. In turn, the semiconductor integrated circuit with high performance can be designed.

EMBODIMENT 2

Figure 8:
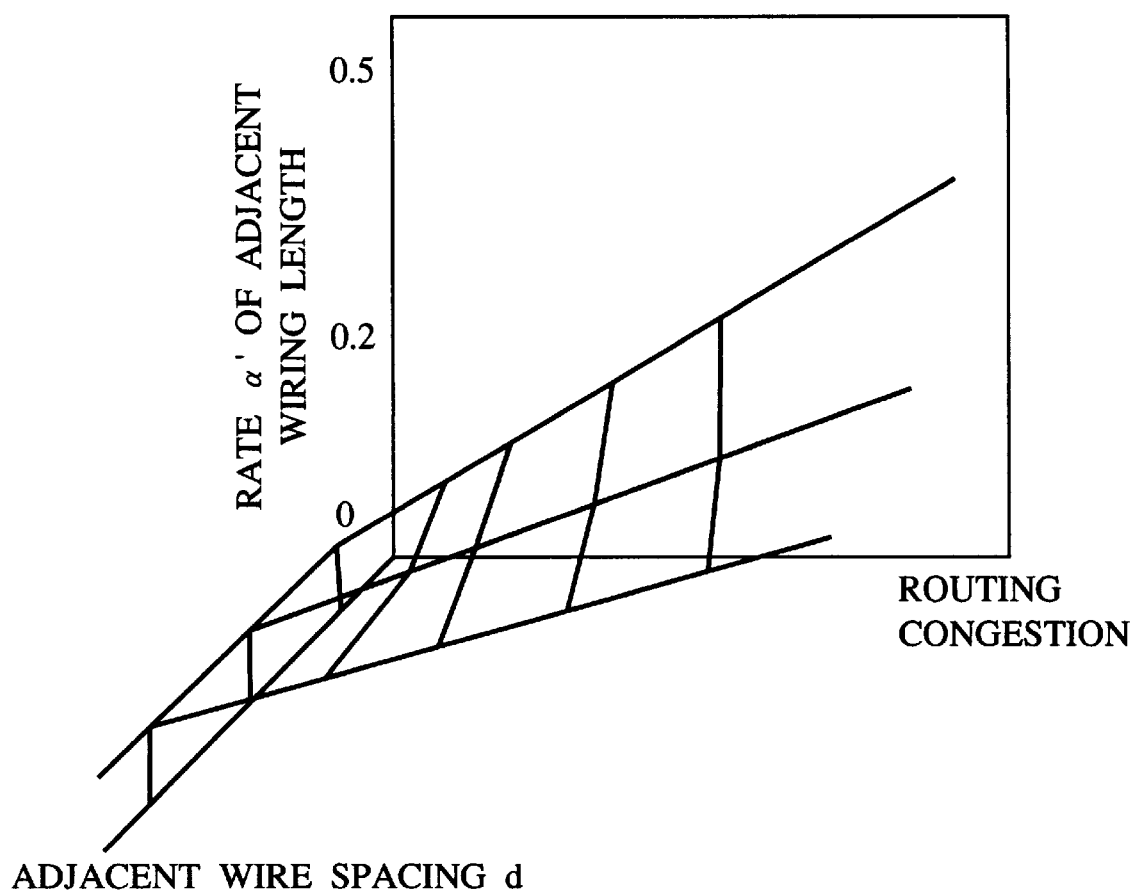
FIG. 8 is a view showing a relationship among an adjacent wire spacing, the routing congestion, and the expected value of the adjacent wiring length.

Next, a second embodiment of the present invention will be explained hereinbelow. FIG. 8 shows the expected value α' of the adjacent wiring length three-dimensionally, wherein an ordinate denotes the adjacent distance d and an abscissa denotes the routing congestion. As shown in FIG. 8, the expected value of the adjacent wiring length with respect to the routing congestion grows smaller as the adjacent wire spacing d becomes wider. In other words, the expected value of the adjacent wiring length with respect to the routing congestion is varied according to the adjacent wire spacing d. Therefore, it is to be noted that, if the adjacent wire spacing d is included as the variable, the capacitances between adjacent wirings can be calculated with better precision.

In the present embodiment, in the process in step S132 in FIG. 5, the expected value of the adjacent wiring length is calculated and, for the objective wiring, the expected value α' of the adjacent wiring length per adjacent wire spacing d is defined by $$\alpha' = f(routing\_congestion, adjacent\_wire\_spacing) \quad (5)$$
$$= K1 \times (routing\_congestion) + K2 \times (adjacent\_wire\_spacing) + \lambda$$

In turn, a prediction value LEr' of the adjacent wiring length in the region can be calculated for respective adjacent wire spacing d according to Eq.(6) (step S133).

$$LEr'(d) = \alpha \times (net\_wiring\_length) \quad (6)$$

Then, a total sum LE' of the adjacent wiring lengths LEr'(d) calculated for respective wiring regions is calculated according to Eq.(7) (step S134).

$$LE' = \sum_r LEr'(d) \quad (7)$$

Next, the capacitances between adjacent wirings are calculated (step S140). The capacitances Cn between adjacent wirings in respective nets are calculated by using Eq.(40 and then added to the interwiring capacitances.

Then, the capacitances between adjacent wirings are calculated by using Eq.(8).

$$Cn = \sum_d \eta \times LE' \quad (8)$$

In this fashion, according to the present embodiment, since the adjacent wire spacing is taken into account, the expected value of the adjacent wiring length can be calculated more precisely. As a result, the capacitance between adjacent wirings can be calculated with better precision.

EMBODIMENT 3

Figure 9:
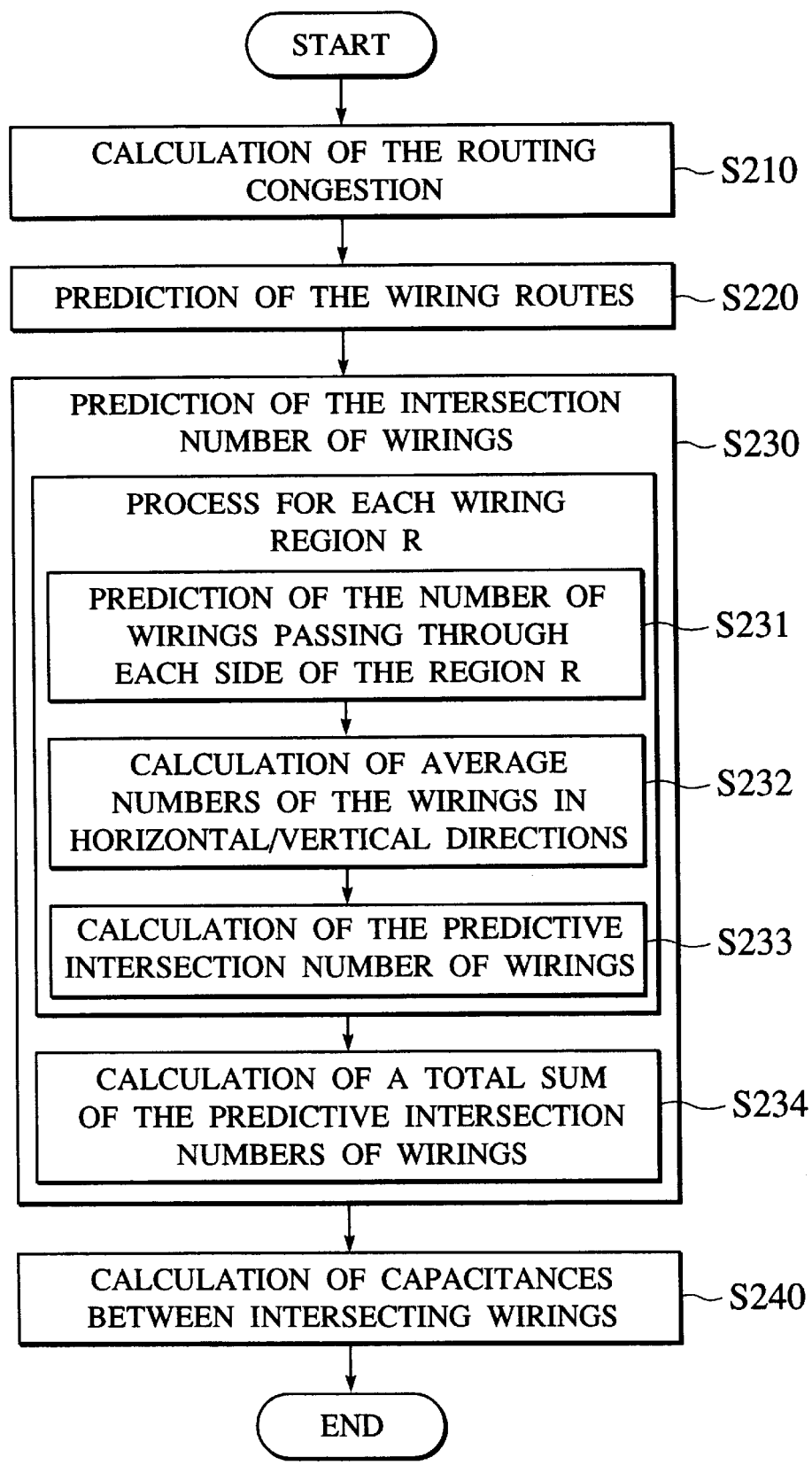
FIG. 9 is a flowchart showing the process carried out by the means 202 for calculating capacitances between intersecting wirings in FIG. 4.

Next, a third embodiment of the present invention will be explained hereinbelow. In this embodiment, the capacitance between intersecting wirings will be calculated. More particularly, the intersecting number is calculated. For this, the intersecting rate of respective wiring layers is calculated based on the routing congestion according to the above function f. In turn, a sum of capacitances between intersecting wirings for respective wiring layers is assumed as the capacitance between intersecting wirings with respect to the wiring. FIG. 9 is a flowchart showing the process carried out by the means 202 for calculating capacitances between intersecting wirings according to the present embodiment. At first, the routing congestion is calculated (step S210). Then, the schematic wiring routes are predicted for respective nets (step S220). Because these processes may be conducted as the same processes as those in the first embodiment, their explanation will be omitted.

Then, the intersection number of wirings is predicted (step S230). The intersection number of wirings is used to predict the number of wirings passing through each side of the regions R (step S231). For example, as explained in FIG. 6, since the routing congestion has been calculated for each side of respective regions, these values may be employed. Then, average numbers of the wirings in horizontal/vertical directions of respective regions are calculated (step S232). The regions are set as rectangles as shown in FIG. 6 and then an average of the routing congestion is calculated for two horizontal sides of the regions. Similarly, an average of the routing congestion is calculated for two vertical sides of the regions. Then, the predictive intersection number of wirings is calculated (step S233). This calculation can be made by calculating the horizontal average number of the wirings passing through the lattice areas for objective line segments of the wiring extended in the vertical direction, then calculating the vertical average number of the wirings passing through the lattice areas for objective line segments of the wiring extended in the horizontal direction, and then calculating a total sum of them. Then, a total sum of the predictive intersection numbers CRr of wirings is calculated by using Eq.(9) (step S234).

$$CR = \sum_r CRr(d) \quad (9)$$

Then, the capacitances between intersecting wirings are calculated (step S240). The capacitances Cn between intersecting wirings in respective nets are calculated by using Eq.(10) and then added to the interwiring capacitances.

$$Cn = CR \times \eta \quad (10)$$

Where η is an average capacitance between intersecting wirings generated by the intersecting wirings having a unit length. In this manner, the rates of adjacent wirings of respective nets can be calculated from the routing congestion for respective regions in the chip. This rates can be estimated with considerable accuracy since the cell placement has been already executed. In addition, since the lengths of intersecting wirings of respective nets can be estimated in respective regions separately, it is possible to estimate the lengths of intersecting wirings, in its turn, the capacitances between intersecting wirings with good accuracy. As a consequence, the capacitances between adjacent/intersecting wirings can be calculated according to the above embodiments.

Figure 10:
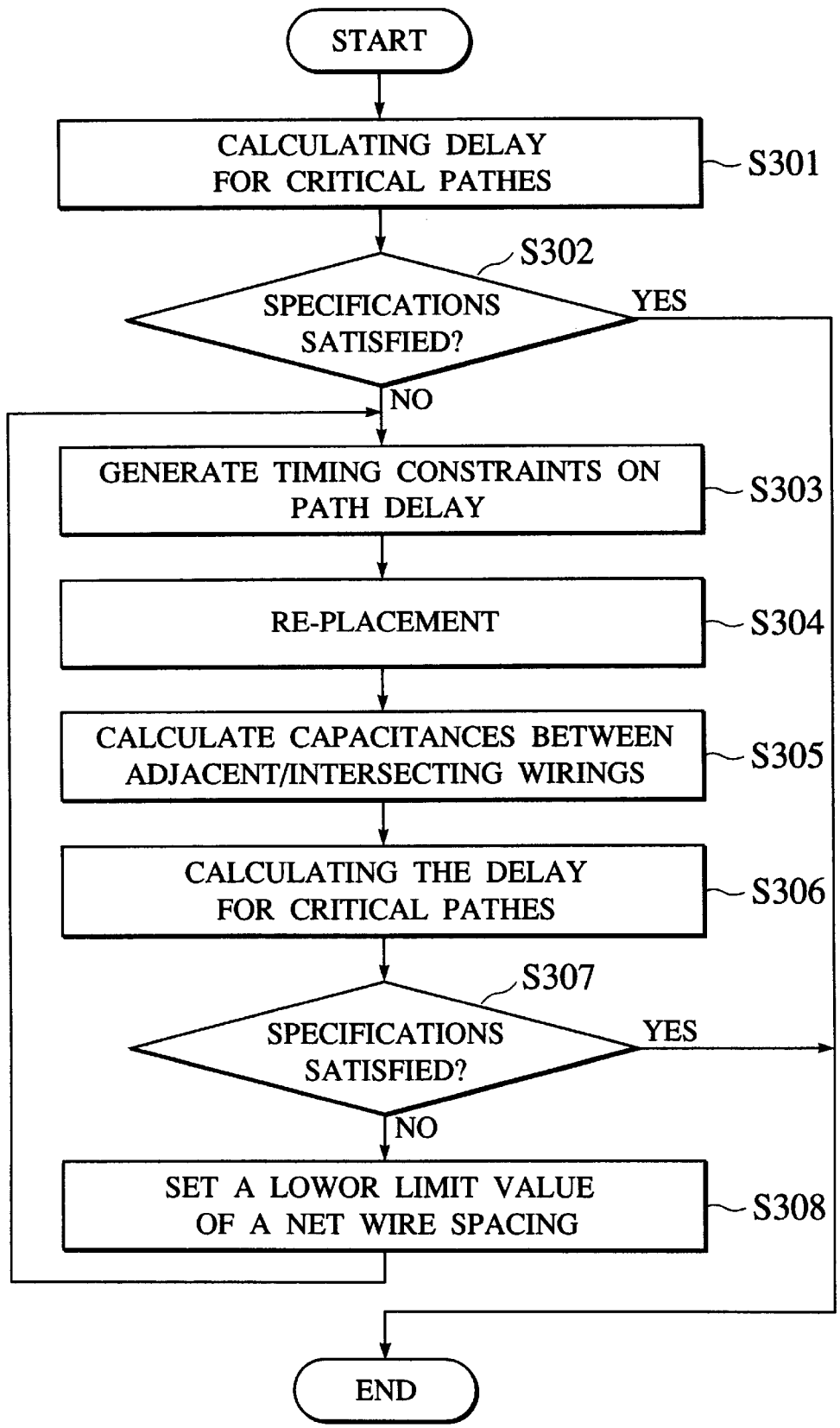
FIG. 10 is a flowchart showing the process carried out by a re-placing means 203 in FIG. 4.

Subsequently, the objective placement of the semiconductor integrated circuit can be improved by the re-placing means 203 shown in FIG. 4. FIG. 10 is a flowchart showing the process carried out by the re-placing means 203. First, based on the capacitances calculated by the above means for calculating the capacitances between adjacent/intersecting wirings, cell delays in the circuit and net delays are calculated and then a critical path is extracted (step S301). Then, it is decided whether or not the delay on the critical path can satisfy the specification of the operating frequency (step S302). If the specification is satisfied, the routing step as succeeding process will be executed without re-placement. On the contrary, unless the specification is satisfied, constraints on path delay for the placement are generated (step S303). Here path delay constraints are generated as the constraint values for respective nets on the critical path which does not satisfy the specification. As the method of generating the timing constraints, the technology set forth in the technical literature (ICCAD'90 "Timing Constraints for Correct Performance", H. Yorssef and E. Shragowtiz.) can be employed.

Then, re-placement to improve the performance is carried out based on the path delay constraints being generated (step S304). Here the automatic placement to improve the path delay is carried out. The automatic placement based on the path delay constraints can be executed by the known method.

In turn, the capacitances between adjacent wirings and/or the capacitances between intersecting wirings are calculated once again (step S305). Because the process conducted by the means 202 for calculating capacitances between adjacent/intersecting wirings may be applied similarly as the calculation method for the above, their explanation will be omitted. Subsequently, based on the calculated capacitances, the cell delays in the circuit and the net delays are calculated and then the critical paths are extracted again (step S306). Next, it is decided whether or not the critical path delay can satisfy the specification of the operating frequency (step S307). If the specification can be satisfied according to this decision, the normal routing process may be carried out without setting of the lower value constraints onto the net wire spacing particularly. In contrast, unless the specification can be satisfied, a lower limit value of the wire spacing of the net constituting the critical path is set as constraint for the wirings (step 308).

Figure 1A:
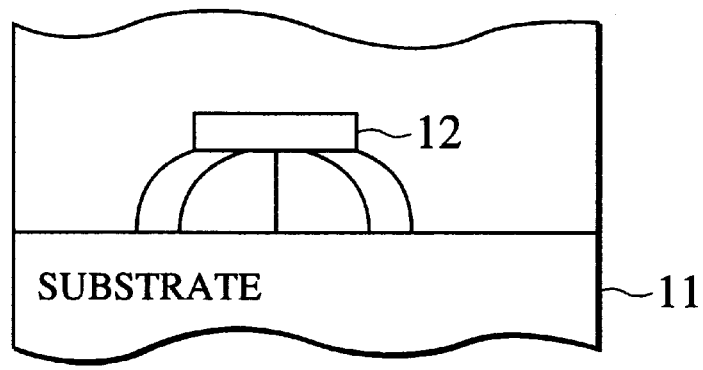
FIG. 1A is a schematic sectional view showing a model illustrative of a wiring capacitance in a simple parallel plates.
Figure 1B:
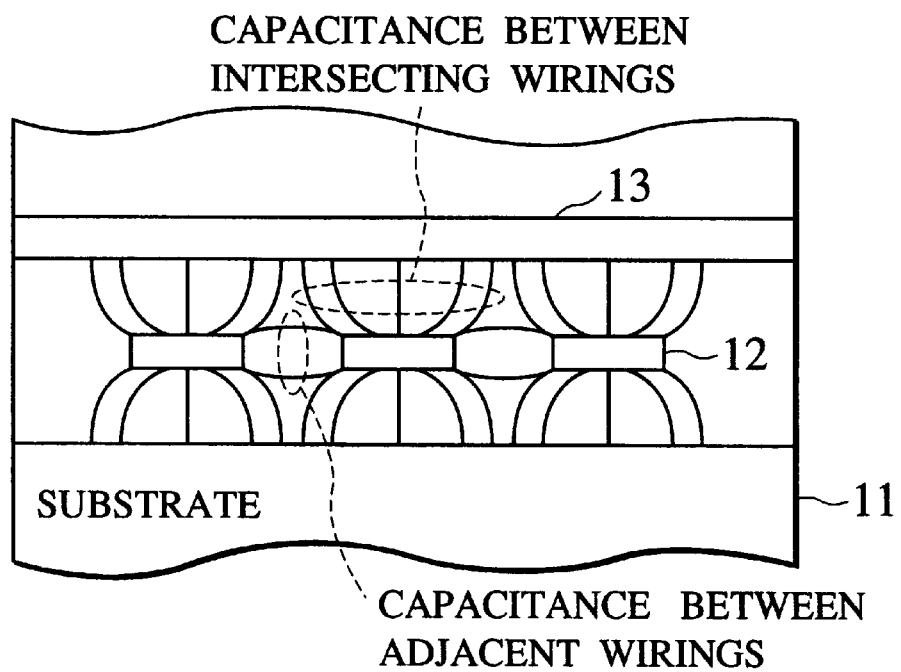
FIG. 1B is a schematic sectional view showing a model illustrative of capacitances between adjacent/intersecting wirings.
Figure 3:
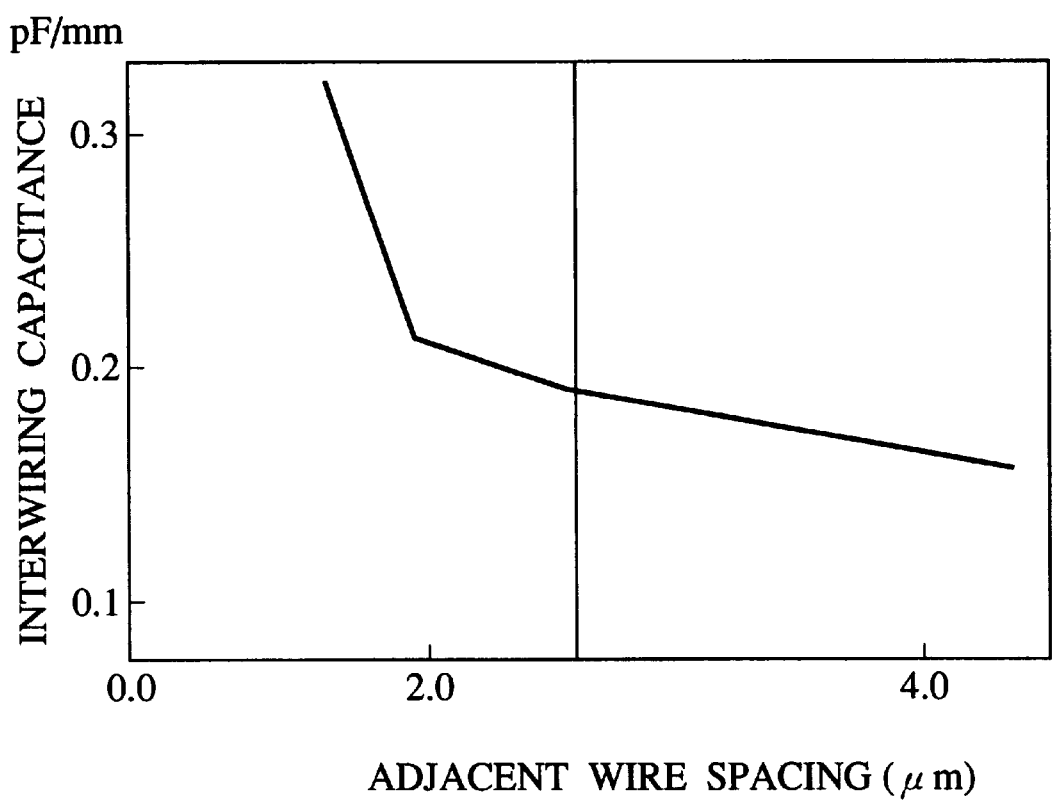
FIG. 3 is a graph showing a relationship between an interwiring capacitance and an adjacent wire spacing.

Next, the routing means 204 in FIG. 3 will be explained. Normal detailed routing will be executed after the process in step S302 in FIG. 10, explained with reference to the above re-placing means, otherwise detailed routing with wire spacing constraints will be executed after the process in step S307. The publicly known technology may be employed as the process for the detailed routing.

Then, the interwiring capacitance calculating means 205 in FIG. 4 will be explained. The interwiring capacitances of the semiconductor integrated circuit to which the detailed routing has been applied are calculated. The publicly known technology may be employed to calculate the interwiring capacitances after the wirings.

Next, the verification section 300 in FIG. 4 will be explained. This verification section 300 executes various verifications of performances, etc. of the semiconductor integrated circuit to which the layout design has been applied.

Like the above, according to the semiconductor integrated circuit design system and the semiconductor integrated circuit design method of the present embodiments, the capacitances between adjacent wirings can be calculated prior to the detailed routing, and performances of the semiconductor integrated circuit can be estimated precisely, and constraints suitable for the automatic routing can be set. Since the placement can be effected to satisfy the constraints, optimization of the detailed layout can be achieved and in turn the semiconductor integrated circuit with high performances can be designed. Accordingly, the semiconductor integrated circuit can be fabricated actually by using the publicly known methods based on the design of the semiconductor integrated circuit. In other words, according to the above embodiments, the design of the semiconductor integrated circuit can be effected and also the semiconductor integrated circuit can be fabricated. In manufacture, the semiconductor device can be manufactured via various predetermined steps such as photolithography step, thin film forming step, etching step, selectively diffusing step, etc. to implement shapes and dimensions of respective portions of the semiconductor device. Here optimization of the detailed layout can be achieved in the design step of the semiconductor integrated circuit, so that the design term can be shortened and also the manufacturing term can be shortened.

As explained as above, according to the semiconductor integrated circuit design system and the semiconductor integrated circuit design method of the present embodiments, when the interwiring capacitance is to be estimated at the design stage in the placement process or after the placement and before the placement, the capacitances between adjacent wirings and the capacitances between intersecting wirings can be estimated with good precision. Also, performances of the semiconductor integrated circuit such as operating frequency, power consumption, etc. can be improved at the placement and routing design stages with regard to the capacitances between adjacent wirings and the capacitances between intersecting wirings.

Furthermore, the rate of adjacent wirings and the rate of intersecting wirings can be calculated for each wiring layer in each wiring direction, which improving the estimation precision of the interwiring capacitances. If the function to obtain the rate of adjacent wirings is prepared with regard to the wiring layer, the wiring direction, and the distance between the adjacent wirings, the capacitances between adjacent wirings can be estimated with good precision and in turn the estimation precision of the interwiring capacitances can be improved.

The program for achieving the above semiconductor integrated circuit design method can be saved in a recording medium. While controlling the computer by installing the recording medium into the computer system and then executing the program, the above semiconductor integrated circuit design method can executed. Where devices for recording the program, for example, a memory device, a magnetic disk drive, an optical disk drive, etc. are included in the recording medium.

What is claimed is:

1. A design method for a semiconductor integrated circuit, comprising:

a placing step of carrying out a layout placement of the semiconductor integrated circuit;

an interwiring capacitance calculating step of calculating capacitances between adjacent wirings of the semiconductor integrated circuit which has been subjected to the layout design effected by the placing step, comprising the steps of:

a wiring route predicting step of predicting routes of wirings of the semiconductor integrated circuit;

an adjacent wiring length predicting step of predicting adjacent wiring length based on predicted routes; and an adjacent wiring capacitance calculating step of calculating the capacitance between the adjacent wirings based on the adjacent wiring lengths being calculated;

a re-placing step of carrying out a layout re-placement of the semiconductor integrated circuit based on calculation results, comprising the steps of:

calculating a critical path by calculating delay based on the capacitances between adjacent wirings or the capacitances between intersecting wirings of the semiconductor integrated circuit, determining whether or not the critical path has satisfied specifications, carrying out the layout re-placement of the semiconductor integrated circuit after generating path delay constraints unless the critical path has satisfied specifications, carrying out the calculation of the capacitances between adjacent wirings of the semiconductor integrated circuit which has been subjected to the layout re-placement, calculating the critical path by calculating delay based on the capacitances between adjacent wirings or the capacitances between intersecting wirings of the semiconductor integrated circuit which has been subjected to the layout re-placement, and setting a lower limit value of net wiring distance unless the critical path has satisfied specifications, and then carrying out the layout re-placement of the semiconductor integrated circuit after generating the path delay constraints.

2. A design method as claimed in claim 1, wherein the wiring route predicting step comprises the steps of, dividing the semiconductor integrated circuit into a plurality of wiring regions, calculating routing congestions of respective wiring regions, and predicting the routes of respective wirings based on the routing congestions.

3. A design method as claimed in claim 1, wherein the wiring route predicting step comprises the steps of, dividing the semiconductor integrated circuit into a plurality of wiring regions, calculating routing congestions for respective sides of wiring regions, and predicting the routes of respective wirings based on the routing congestions.

4. A design method as claimed in claim 1, wherein the wiring route predicting step comprises the steps of, dividing the semiconductor integrated circuit into a plurality of wiring regions, calculating routing congestion for respective wiring layers of the wiring regions, and predicting the routes of respective wirings based on the routing congestions.

5. A design method as claimed in claim 1, wherein the adjacent wiring length predicting step comprises the steps of, dividing the semiconductor integrated circuit into a plurality of wiring regions, calculating routing congestion of respective wiring regions, and predicting the adjacent wiring lengths based on the routing congestions.

6. A design method as claimed in claim 1, wherein the adjacent wiring length predicting step comprises the steps of, dividing the semiconductor integrated circuit into a plurality of wiring regions to predict wiring lengths passing through respective wiring regions, predicting expected values of adjacent wiring lengths of respective wiring regions based on routing congestions, and predicting the adjacent wiring lengths of respective wiring regions based on predicted expected values of the adjacent wiring lengths.

7. A design method as claimed in claim 6, wherein the step of predicting expected values of adjacent wiring lengths of respective wiring regions based on routing congestions, includes the steps of calculating the expected values of adjacent wiring lengths as a function of routing congestion.

8. A design method as claimed in claim 6, wherein the step of predicting expected values of adjacent wiring lengths of respective wiring regions based on routing congestions, includes the step of calculating the expected values of adjacent wiring lengths as functions of routing congestion and adjacent wire spacing.

9. A design method as claimed in claim 6, wherein the adjacent wiring length predicting step comprises the steps of, calculating wiring lengths and directions of respective wirings and wiring layers, for respective wiring regions through which wirings pass, calculating the expected values of adjacent wiring lengths for respective wiring regions based on calculated routing congestion, calculating predicted values of the adjacent wiring lengths for respective wiring regions, and calculating a total sum of adjacent wiring lengths based on the predicted values of the adjacent wiring lengths.

10. A design method for a semiconductor integrated circuit, comprising:

a placing step of carrying out a layout placement of the semiconductor integrated circuit;

an interwiring capacitance calculating step of calculating capacitances between intersecting wirings of the semiconductor integrated circuit which has been subjected to the layout placement effected by the placing step; and a re-placing step of carrying out a layout re-placement of the semiconductor integrated circuit based on calculation results;

wherein the interwiring capacitance calculating step comprises, a wiring route predicting step of predicting routes of wirings of the semiconductor integrated circuit, an intersecting wiring predicting step of predicting a number of the intersecting wirings based on predicted routes, and an intersecting wiring capacitance calculating the step of calculating the capacitances between the intersecting wirings based on the number of the intersecting wirings being calculated.

11. A design method as claimed in claim 10, wherein the intersecting wiring predicting step comprises the steps of, dividing the semiconductor integrated circuit into a plurality of wiring regions, predicting wiring lengths passing through respective wiring regions, calculating a number of wirings passing through respective sides of respective wiring regions, calculating average numbers of wirings passing through vertical sides and horizontal sides of respective wiring regions, calculating an intersecting number of wirings based on the average number of wirings, and calculating a total intersecting number of wirings based on intersecting numbers of wirings being calculated for respective wiring regions.

12. A design method as claimed in claim 10, wherein the wiring route predicting step comprises the steps of, dividing the semiconductor integrated circuit into a plurality of wiring regions, calculating routing congestions of respective wiring regions, and predicting the routes of respective wirings based on the routing congestions.

13. A design method as claimed in claim 10, wherein the wiring route predicting step comprises the steps of, dividing the semiconductor integrated circuit into a plurality of wiring regions, calculating routing congestions for respective sides of wiring regions, and predicting the routes of respective wirings based on the routing congestions.

14. A design method as claimed in claim 10, wherein the wiring route predicting step comprises the steps of, dividing the semiconductor integrated circuit into a plurality of wiring regions, calculating routing congestion for respective wiring layers of the wiring regions, and predicting the routes of respective wirings based on the routing congestions.

15. A design method as claimed in claim 10, wherein the re-placing step comprises the steps of, carrying out a calculation of capacitances between adjacent wirings or capacitances between intersecting wirings of the semiconductor integrated circuit which has been subjected to the layout placement effected by the placing step, calculating a critical path by calculating delay based on the capacitances between adjacent wirings or the capacitances between intersecting wirings of the semiconductor integrated circuit, determining whether or not the critical path has satisfied specifications, carrying out the layout re-placement of the semiconductor integrated circuit after generating path delay constraints unless the critical path has satisfied specifications, carrying out the calculation of the capacitances between adjacent wirings of the semiconductor integrated circuit which has been subjected to the layout re-placement, calculating the critical path by calculating delay based on the capacitances between adjacent wirings or the capacitances between intersecting wirings of the semiconductor integrated circuit which has been subjected to the layout re-placement, and setting a lower limit value of net wiring distance unless the critical path has satisfied specifications, and then carrying out the layer re-placement of the semiconductor integrated circuit after generating the path delay constraints.

16. A computer-readable recording medium for recording a design program for a semiconductor integrated circuit, comprising:

a placing step of carrying out a layout placement of the semiconductor integrated circuit;

an interwiring capacitance calculating step of calculating capacitances between adjacent wirings or capacitances between intersecting wirings of the semiconductor integrated circuit which has been subjected to the layout design effected by the placing step; and a re-placing step of carrying out a layout re-placement of the semiconductor integrated circuit based on calculation results;

wherein the interwiring capacitance calculating step comprises, a wiring route predicting step of predicting routes of wirings of the semiconductor integrated circuit, an adjacent wiring length predicting step of predicting adjacent wiring lengths based on predicted routes, and an adjacent wiring capacitance calculating step of calculating the capacitances between the adjacent wirings based on the adjacent wiring lengths being calculated.

17. A method of manufacturing a semiconductor integrated circuit, comprising:

a placing step of carrying out a layout placement of the semiconductor integrated circuit;

an interwiring capacitance calculating step of calculating capacitances between adjacent wirings of capacitances between intersecting wirings of the semiconductor integrated circuit which has been subjected to the layout design effected by the placing step;

a re-placing step of carrying out a layout re-placement of the semiconductor integrated circuit based on calculation results;

a wiring step of carrying out a layout wiring of the semiconductor integrated circuit which has been subjected to the layout re-placement; and a manufacturing step of manufacturing the semiconductor integrated circuit which has been subjected to the layout wiring;

wherein the interwiring capacitance calculating step comprises, a wiring route predicting step of predicting routes of wirings of the semiconductor integrated circuit, an adjacent wiring length predicting step of predicting adjacent wiring lengths based on predicted routes, and an adjacent wiring capacitance calculating step of calculating the capacitances between the adjacent wirings based on the adjacent wiring lengths being calculated.

18. A design system for a semiconductor integrated circuit, comprising:

a placing unit for carrying out a layout placement of the semiconductor integrated circuit;

an interwiring capacitance calculator for calculating capacitances between adjacent wirings of the semiconductor integrated circuit which has been subjected to the layout design effected by the placing unit, comprising:

a wiring route predicting unit for predicting routes of wirings of the semiconductor integrated circuit, an adjacent wiring length predicting unit for predicting adjacent wiring lengths based on predicted routes, and an adjacent wiring capacitance calculator for calculating the capacitances between the adjacent wirings based on the adjacent wiring lengths being calculated;

a re-placing unit for carrying out a layout re-placement of the semiconductor integrated circuit based on calculation results, comprising:
- a first circuit path calculating unit for calculating a critical path by calculating delay based on the capacitances between adjacent wirings or the capacitances between intersecting wirings of the semiconductor integrated circuit;
- a determination unit for determining whether or not the critical path has satisfied specifications;
- a layout re-placement unit for re-placing layout of the semiconductor integrated circuit after generating path delay constraints unless the critical path has satisfied specifications;
- a second interwiring capacitance calculator for calculating of the capacitances between adjacent wirings of the semiconductor integrated circuit which has been subjected to the layout re-placement;
- a second critical path calculator for calculating the critical path by calculating delay based on the capacitances between adjacent wirings or the capacitances between intersecting wirings of the semiconductor integrated circuit which has been subjected to the layout re-placement; and
- a net wiring setting unit for setting a lower limit value of net wiring distance unless the critical path has satisfied specifications, and then carrying out the layout re-placement of semiconductor integrated circuit after generating the path delay constraints.

19. A design system for a semiconductor integrated circuit, comprising:

a logic design unit for carrying out a logic design of the semiconductor integrated circuit;

a placing unit for carrying out a layout placement of the semiconductor integrated circuit which has been subjected to the logic design;

an interwiring capacitance calculator for calculating capacitances between adjacent wirings of the semiconductor integrated circuit which has been subjected to the layout placement effected by the placing unit, comprising:
- a wiring route predicting unit for predicting routes of wirings of the semiconductor integrated circuit,
- an adjacent wiring length predicting unit for predicting adjacent wiring lengths based on predicted routes, and
- an adjacent wiring capacitance calculator for calculating the capacitances between the adjacent wirings based on the adjacent wiring lengths being calculated;

a re-placing unit for carrying out a layout re-placement of the semiconductor integrated circuit based on calculation results comprising:
- a first critical path calculating unit for calculating a critical path by calculating delay based on the capacitances between adjacent wirings or the capacitances between intersecting wirings of the semiconductor integrated circuit;
- a determination unit for determining whether or not the critical path has satisfied specifications;
- a layout re-placement unit for re-placing layout of the semiconductor integrated circuit after generating path delay constraints unless the critical path has satisfied specifications;
- a second interwiring capacitance calculator for calculating of the capacitances between adjacent wirings of the semiconductor integrated circuit which has been subjected to the layout re-placement;
- a second critical path calculator for calculating the critical path by calculating delay based on the capacitances between adjacent wirings or the capacitances between intersecting wirings of the semiconductor integrated circuit which has been subjected to the layout re-placement; and
- a net wiring setting unit for setting a lower limit value of net wiring distance unless the critical path has satisfied specifications, and then carrying out the layout re-placement of semiconductor integrated circuit after generating the path delay constraints.

20. A design system for a semiconductor integrated circuit, comprising:

a placing unit for carrying out a layout placement of the semiconductor integrated circuit which has been subjected to the logic design;

an interwiring capacitance calculator for calculating capacitances between intersecting wirings of the semiconductor integrated circuit which has been subjected to the layout placement effected by the placing unit, comprising:
- a wiring route predicting unit for predicting routes of wirings of the semiconductor integrated circuit,
- an intersecting wiring predicting unit for predicting a number of the intersecting wirings based on predicted routes, and
- an intersecting wiring capacitance calculating unit for calculating the capacitance between the intersecting wirings based on the number of intersecting wirings being calculated;

a re-placing unit for carrying out a layout re-placement of the semiconductor integrated circuit based on calculation results comprising:
- a first critical path calculating unit for calculating a critical path by calculating delay based on the capacitances between intersecting wirings of the semiconductor integrated circuit;
- a determination unit for determining whether or not the critical path has satisfied specifications;
- a layout re-placement unit for re-placing layout of the semiconductor integrated circuit after generating path delay constraints unless the critical path has satisfied specifications;
- a second interwiring capacitance calculator for calculating of the capacitances between intersecting wirings of the semiconductor integrated circuit which has been subjected to the layout re-placement;
- a second critical path calculator for calculating the critical path by calculating delay based on the capacitances between intersecting wirings of the semiconductor integrated circuit which has been subjected to the layout re-placement; and
- a net wiring setting unit for setting a lower limit value of net wiring distance unless the critical path has satisfied specifications, and then carrying out the layout re-placement of semiconductor integrated circuit after generating the path delay constraints.

* * * * *